US012605940B2

(12) United States Patent
Doran et al.

(10) Patent No.: US 12,605,940 B2
(45) Date of Patent: Apr. 21, 2026

(54) METHOD AND DEVICE FOR PRINTING ON A SUBSTRATE BY MEANS OF INKJET PRINTING

(71) Applicant: NOTION SYSTEMS GMBH, Schwetzingen (DE)

(72) Inventors: Michael Doran, Dossenheim (DE); Rolf Schneider, Schriesheim (DE); Jan Schoenefeld, Leimen (DE)

(73) Assignee: NOTION SYSTEMS GMBH, Schwetzingen (DE)

( * ) Notice: Subject to any disclaimer, the term of this patent is extended or adjusted under 35 U.S.C. 154(b) by 333 days.

(21) Appl. No.: 18/264,785

(22) PCT Filed: Feb. 8, 2022

(86) PCT No.: PCT/EP2022/053031
    § 371 (c)(1),
    (2) Date: Aug. 9, 2023

(87) PCT Pub. No.: WO2022/171634
    PCT Pub. Date: Aug. 18, 2022

(65) Prior Publication Data
    US 2024/0408891 A1     Dec. 12, 2024

(30) Foreign Application Priority Data

Feb. 9, 2021     (DE) ..................... 10 2021 102 947.3

(51) Int. Cl.
    *B41J 2/21*          (2006.01)
    *B41M 3/00*          (2006.01)
    (Continued)

(52) U.S. Cl.
    CPC ............ *B41J 2/2135* (2013.01); *B41M 3/008* (2013.01); *B41M 5/0047* (2013.01); (Continued)

(58) Field of Classification Search
    CPC ...... B41J 2/2135; B41J 2/2132; B41J 3/4076; B41M 3/008; B41M 5/0047; G02F 1/133516; H10K 71/135
    See application file for complete search history.

(56) References Cited

U.S. PATENT DOCUMENTS

| | | | |
|---|---|---|---|
| 6,939,407 | B2 | 9/2005 | Kawase et al. |
| 10,981,394 | B2 | 4/2021 | Dobelt et al. |

(Continued)

FOREIGN PATENT DOCUMENTS

| | | |
|---|---|---|
| CN | 1358626 A | 7/2002 |
| CN | 110167761 A | 8/2019 |

(Continued)

OTHER PUBLICATIONS

English Abstract for JP 10-300918 A (1998).
Office Action for CN 202280013938.X dated Jul. 30, 2025.

*Primary Examiner* — Yaovi M Ameh
(74) *Attorney, Agent, or Firm* — Caesar Rivise, PC

(57)          ABSTRACT

The invention relates to a method for printing on a substrate by means of inkjet printing, in which method landing zones are provided on the substrate in a landing zone grid consisting of landing zone columns and landing zone rows, and the landing zones are each printed on using an individual pattern consisting of one or more drops by means of one or more print head nozzles of a print head, wherein the print head nozzles are moved over a surface of the substrate along an imaginary nozzle path during printing. The invention also relates to a device for printing on a substrate comprising a landing zone grid consisting of landing zone columns and landing zone rows by means of inkjet printing. In order to provide a method and a device for printing on a substrate by means of inkjet printing, which method and device allow a substrate to be printed on efficiently and simply, with the print result being particularly uniform and without unwanted (Continued)

Figure 1:
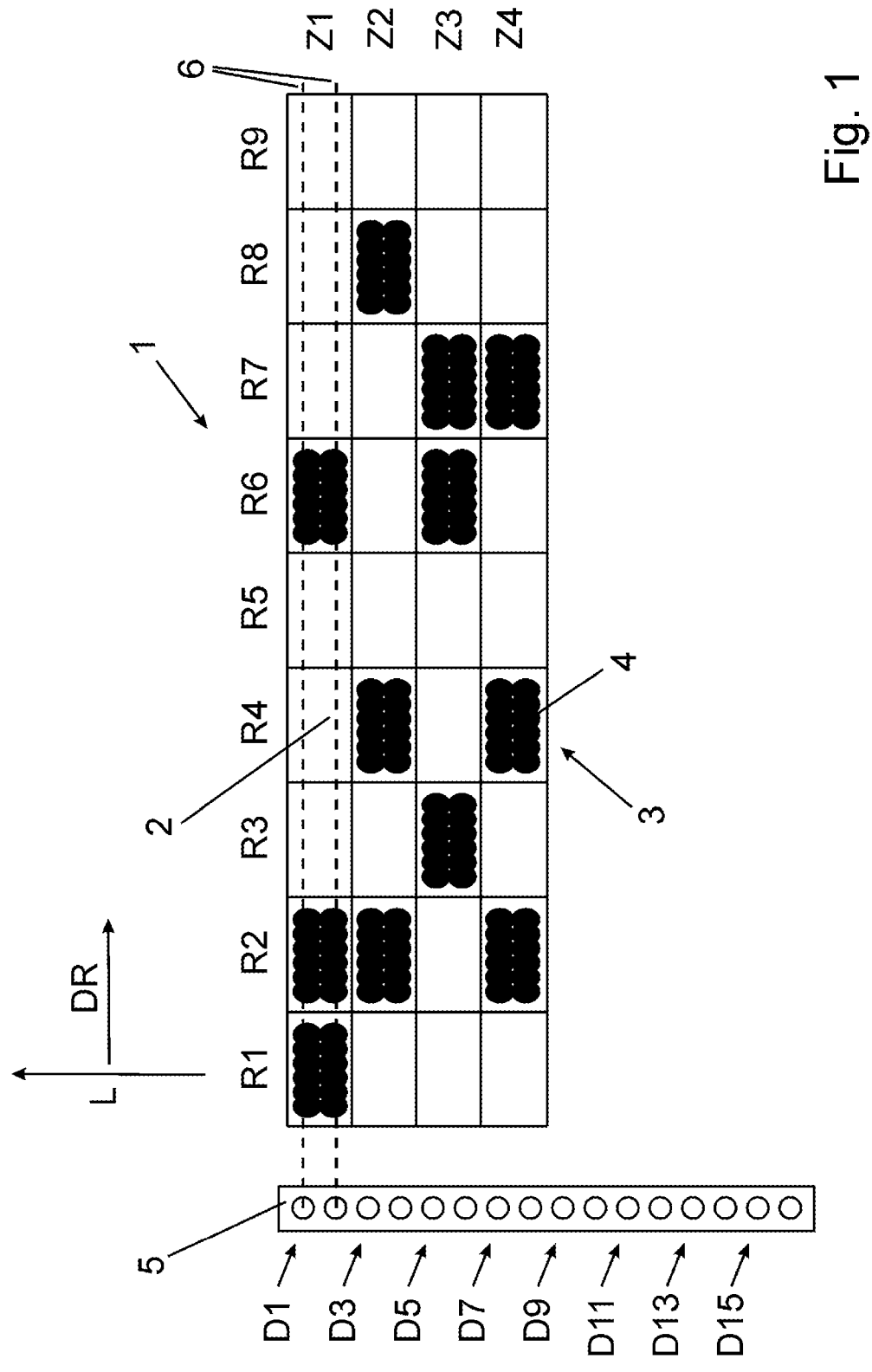

artefacts and in particular the printed surface being free from lines and Moiré effects, in the method landing zones are provided on the substrate in a landing zone grid consisting of landing zone columns and landing zone rows, and the landing zones are each printed on using an individual pattern consisting of drops by means of print head nozzles of a print head, wherein the print head nozzles and the surface of the substrate are moved relative to one another along an imaginary nozzle path during printing. All individual patterns of a print nozzle path are printed in multiple passes, wherein in each pass only parts of individual patterns and/or only some of all individual patterns are printed along the nozzle path in landing zones, and in at least one subsequent pass missing parts of individual patterns or further entire individual patterns are printed in incomplete or empty landing zones. In addition, between the individual passes, the print head and the surface of the substrate are moved relative to one another laterally to the nozzle path by a lateral offset.

17 Claims, 9 Drawing Sheets

(51) Int. Cl.
  *B41M 5/00* (2006.01)
  *B41J 3/407* (2006.01)
  *G02F 1/1335* (2006.01)
  *H10K 71/13* (2023.01)

(52) U.S. Cl.
  CPC ............ *B41J 2/2132* (2013.01); *B41J 3/4076* (2013.01); *G02F 1/133516* (2013.01); *H10K 71/135* (2023.02)

(56)        References Cited

U.S. PATENT DOCUMENTS

| | | | |
|---|---|---|---|
| 2003/0137557 | A1 | 7/2003 | Nakamura |
| 2008/0259106 | A1 | 10/2008 | Chou et al. |
| 2009/0122110 | A1 | 5/2009 | Yoshioka |
| 2009/0195574 | A1 | 8/2009 | Chen et al. |
| 2010/0201731 | A1 | 8/2010 | Saito |
| 2011/0198661 | A1* | 8/2011 | Dowling ............. H10K 71/135 |
| | | | 438/34 |
| 2013/0002745 | A1 | 1/2013 | Izoe |
| 2014/0184683 | A1 | 7/2014 | Harjee et al. |
| 2015/0015626 | A1* | 1/2015 | Kayahara ............... B41J 2/2132 |
| | | | 347/9 |
| 2019/0210052 | A1 | 7/2019 | Baker et al. |

FOREIGN PATENT DOCUMENTS

| | | | | |
|---|---|---|---|---|
| EP | 0984303 | A1 * | 3/2000 | ............ G02B 5/201 |
| EP | 0984303 | B1 | 4/2003 | |
| JP | 10-300918 | A | 11/1998 | |

* cited by examiner

METHOD AND DEVICE FOR PRINTING ON A SUBSTRATE BY MEANS OF INKJET PRINTING

CROSS-REFERENCE TO RELATED APPLICATIONS

This application is a Section 371 of International Application No. PCT/EP2022/053031 filed Feb. 8, 2022, which was published under International Publication No. WO 2022/171634 A1, which claims priority to Germany patent application 10 2021 102 947.3, filed Feb. 9, 2021, the disclosures of which are incorporated herein by reference in their entireties.

The invention relates to a method for printing on a substrate by means of inkjet printing and to a device for printing on a substrate having a landing zone grid consisting of landing zone columns and landing zone rows by means of inkjet printing.

Methods for printing on a substrate by means of inkjet printing and corresponding devices are known in a variety of configurations from the prior art and are used for numerous applications, for example for printing both rigid and flexible substrates. The methods and devices for inkjet printing are particularly suitable for specific applications which require a precise quantity of a functional liquid to be placed into multiple precisely provided surface regions of the substrate, the respective landing zones. Such applications relate, for example, to technical or medical sensor surfaces, reaction surfaces for medical applications or else pixel areas of displays, such as LCDs, TFTs, OLED displays, or e-paper.

In particular when printing RGB patterns as color filters on e-paper displays, numerous landing zones are typically printed, wherein the size of each individual pattern to be printed can be very different and in this case both very small, for example 40×40 μm, but also large, such as 200×1000 μm. However, a typical size of the individual patterns is about 60×200 μm. In order to enable a colored representation by means of e-paper, a printed color layer, in particular individual red (R), green (G) and blue (B) pixel areas as filters, is visible in the regions in which the underlying e-paper is driven white. By contrast, the e-paper pixels which are driven black absorb the light so that the printed RGB color filter is visible only very weakly and thus the e-paper pixels appear almost without any color impression. Usually, in the case of colored e-paper, three colored subpixels (RGB) and optionally additionally a white subpixel form a pixel of a high-resolution pixel array. Each (colored) subpixel represents a landing zone for printing.

In order to achieve a high quality of the print result, in particular the surface of an e-paper, it is necessary for the individual subpixels to be formed uniformly over the entire surface of the substrate. Both the positioning and size of the pixels and the quantity of the color filter emitted in each subpixel as the landing zone of the print is of great importance within narrow limits.

In order to be able to obtain a reproducible and unwanted-artefact-free print result, it is customary in the prior art in the applications of inkjet printing for metering that the exact same number of inkjet drops are placed in each landing zone of a landing zone type, i.e., in all landing zones of the same function, color, shape and/or size.

Nevertheless, slightly different drop volumes of the various print head nozzles, or even nozzle positions and/or alignments slightly deviating from a nominal position within the print head, can leave a clearly visible optical impression deviating from the average, since in each case numerous individual patterns of a column in the printing direction on the substrate are printed by the same defective print head nozzle or adjacent defective print head nozzles. In particular, a printing characteristic of an individual print head nozzle that deviates noticeably from the average of all print head nozzles results in a visible strip being formed.

However, the eye of a viewer is very sensitive in the event of such intensity differences in the printed substrate, in particular in the case of color filters of e-paper, at least if multiple printed individual patterns have identical defective properties adjacently to one another and/or amongst one another, which are at the same time slightly different from the remaining individual patterns of an adjacent region.

In practice, such slight differences frequently result from inherent print head nozzle fluctuations, wherein the visual impression of a subpixel of other subpixels deviates significantly when the printed areas are of different sizes, although the exactly equal amount of ink was printed. Conversely, the impression with the same area, but slightly different amounts of ink is likewise markedly different. Thus, position fluctuations of the print head nozzles, which lead to fluctuations in area, and/or real volume fluctuations of the ink quantity, can lead to such undesired effects.

A different temporal impact of the droplets of an individual pattern on the substrate can also lead to a different optical impression of multiple individual patterns, since the printing medium on the substrate is possibly not immediately absorbed and surface stress effects of the drop just printed can lead to a systematic flow of the printing medium towards already previously printed drops.

Lastly, a deviating optical impression and in particular a strip formation due to a digital quantization of the printer head resolution and the pattern of an e-paper display to be printed may occur, which leads to a classical Moiré effect. In particular, if the measure of the landing zone grid of the substrate and the native print head resolution or the print line distance are not integer multiples of one another, an offset occurs from landing zone row to landing zone row under the print head and can accumulate as the number of print head nozzles arranged next to one another on the print head increases, such that a landing zone row offset visible in the print result occurs, up to a strong unwanted artefact, in which there is an unprinted line or a recognisable variation in the spacing of printed patterns.

The object of the invention is therefore to provide a method and a device for printing on a substrate by means of inkjet printing, which method and device enable a printing of a substrate efficiently and in a simple manner, wherein the print result is particularly uniform and free of unwanted artefacts, and in particular the printed surface is free of lines and Moiré effects.

The object is achieved according to the invention by a method according to claim 1 and by a device according to claim 16. Advantageous developments of the invention can be found in the dependent claims.

In the method according to the invention for printing a substrate by means of inkjet printing, landing zones are provided on the substrate in a landing zone grid consisting of landing zone columns and landing zone rows, and the landing zones are printed in each case with an individual pattern consisting of one or more drops by means of one or more print head nozzles of one or more print heads, the print head nozzle or the print head nozzles and the surface of the substrate being moved relative to one another along an imaginary nozzle path during printing. In order to obtain a particularly uniform and unwanted-artefact-free print result, all individual patterns of a landing zone column and/or a landing zone row or a print nozzle path are printed in multiple passes, wherein in each pass only parts of individual patterns and/or only some of all individual patterns are printed along the nozzle path or in the region of the print head, in particular of all landing zone columns and/or landing zone rows located under the print head, in landing zones, and in at least one subsequent pass missing parts of individual patterns or further entire individual patterns are printed in incomplete or empty landing zones. In addition, between the individual passes, the print head and the surface of the substrate are moved relative to one another laterally to the nozzle path by a lateral offset.

The device according to the invention for printing a substrate comprising a landing zone grid consisting of landing zone columns and landing zone rows by means of inkjet printing has a print head comprising multiple print head nozzles spaced apart from one another at a distance from one another, for printing in each case an individual pattern consisting of one or more drops in a landing zone of the loading zone grid by means of one or more print head nozzles, and a positioning drive for moving the print head and the surface of the substrate relative to one another along an imaginary nozzle path of each of the print head nozzles and in a direction laterally to the nozzle paths. Furthermore, the device has a control unit for controlling the printing process, in particular the positioning drive, wherein the control unit is designed in such a way that all individual patterns of a landing zone column and/or a landing zone row or a print nozzle path are printed in multiple passes, wherein in each pass only parts of individual patterns and/or only some of all individual patterns are printed along the nozzle path or in the region of the print head, in particular of all landing zone columns and/or landing zone rows located under the print head, in landing zones, and in at least one subsequent pass missing parts of individual patterns or further entire individual patterns are printed in incomplete or empty landing zones, and the print head and the surface of the substrate are moved relative to one another between the individual passes laterally to the nozzle path by a lateral distance.

The inventors have recognized that the printing of all individual patterns should be carried out in multiple passes and in particular preferably additionally in multiple positions in order to compensate for the deviating optical impression of individual portions on the substrate surface, in particular individual landing zone columns, which is relatively easily recognizable to the eye of an observer, wherein parts of individual patterns or entire individual patterns are printed (pseudo-) randomly in each case only in one pass. Between the passes, the print head is moved laterally relative to the substrate into another position so that the already previously printed parts of individual patterns or previously printed complete individual patterns would be printed by other print head nozzles of the print head if it were desired to print them again in the changed lateral position of the print head. Accordingly, free positions, in particular unprinted landing zones, between the already printed individual patterns are now printed by different print head nozzles as compared to the previously printed individual patterns, as a result of which a disadvantageous effect of individual print head nozzles does not have a detrimental effect on an entire landing zone column and in this way the formation of an unwanted artefact or strip is effectively avoided.

If, for example, 100,000 red individual patterns are to be printed on a display and the printing takes place in three passes, approximately ⅓ of the individual patterns which are to be printed in the respective pass are selected (pseudo-) randomly in each pass. Each individual pattern is preferably printed in exactly one pass and all 100,000 individual patterns are printed in succession. Between the passes, the print head is displaced by a predetermined distance in the lateral direction, this distance preferably being at least greater than a printed individual pattern and particularly preferably a few millimeters, i.e., is significantly greater than the individual patterns.

Printing is understood in principle to mean a method in which a liquid or flowable printing medium is applied to a surface, this being performed in a targeted manner according to a template, according to a predetermined pattern and/or at a predetermined position. According to the invention, the printing method is an inkjet printing, i.e., a matrix printing, in which the printing medium to be applied is applied in drops or as a jet to the medium to be printed. Accordingly, the printing preferably takes place without contact, i.e., without direct contact between the device for printing and the substrate.

For printing, the device has one or more print heads, which can be moved relative to the substrate to be printed so that different positions of the substrate can be printed. Both the print head can be stationary and the substrate can be moved, and the substrate can be fixed and the print head can be moved. In principle, the print head has at least one print head nozzle for dispensing drops or a jet of the printing medium, wherein preferably numerous print head nozzles are arranged on the print head in a row and particularly preferably equidistantly relative to one another. In addition, the print head nozzles can also be arranged on the print head in multiple rows, in particular one behind the other and/or laterally offset from one another in a printing direction. Very particularly preferably, the individual print head nozzle rows are offset laterally with respect to one another in such a way that all nozzle paths of the print head have the same distance from one another, whereby a uniform lateral resolution is achieved.

The substrate surface lying under the region of the print head nozzles during printing and preferably during an individual pass of the print head relative to the substrate surface is referred to as a print head path, while the perpendicular projection of each individual print head nozzle towards the surface of the substrate of a trajectory to be traveled over during the printing process is referred to as a nozzle path. Accordingly, the nozzle path is not necessarily imaged physically on the substrate, but is first of all an imaginary course. However, if a print nozzle were to release a printing medium continuously over the maximum printing region or along a landing zone column during a linear movement, the nozzle path would be reproduced on the surface of the substrate by means of the printing medium. In this case, the nozzle path can in principle run both linearly and can have any other non-linear profile. Preferably, the nozzle path is aligned with up to an angular deviation <10°, particularly preferably <5°, very particularly preferably <2° and in particular preferably completely parallel to the landing zone columns, or alternatively is also aligned parallel to the landing zone rows correspondingly, possibly including an aforementioned angular deviation. Alternatively, however, the print nozzle path can also have any angle to the landing zone columns or the landing zone rows. An embodiment of the method which takes place in an alignment-free manner, i.e., without an alignment of the substrate relative to the print nozzle path prior to the printing, in particular on the basis of alignment features. A print head with multiple print head nozzles arranged in a row generates multiple imaginary nozzle paths over the substrate surface during an individual pass of the substrate, with the distance between the nozzle paths corresponding to the native lateral resolution of the print head.

The printing medium can in principle be any liquid and can be used for any purposes. The printing medium can be based, for example, on an aqueous or non-aqueous solvent and can also have any further functional components, for example dyes and pigments, but also chemically and/or biochemically active substances. Particularly preferably, the printing medium is an ink or a filter dye solution to print a subpixel of a display.

The substrate can in principle be formed from any material and can have any shape, the substrate preferably having a planar, printable surface and particularly preferably being formed generally flat, in particular as a plate or film. The substrate can be both rigid and flexible. An example of a flexible substrate is a flexible EPD (electronic paper display) which, as an unprinted substrate, has an original black/white resolution of 150 ppi with, in each case, a TFT pixel size of 170 µm. In order to generate a color display based on such an EPD, an RGB filter is printed on top of each black/white TFT pixel, with each color pixel usually being somewhat smaller than the TFT pixel size, e.g., only 150 µm. The resulting color display resolution is then for example 75 ppi. In this case, several, for example four, landing zone grids are preferably arranged on the surface of the substrate, shifted relative to one another, wherein a grid with a red color filter, a grid with a green color filter, and a grid with blue color filter are printed and the fourth grid remains unprinted. Further preferably, at least one landing zone of a landing zone type, for example of a color, is arranged in each TFT pixel.

An important criterion for high quality is the precise placement of color pixels into the provided positions of each TFT pixel, with these target positions typically being predetermined as landing zones by the substrate, for example in the form of depressions in the substrate or as a TFT grid. While other criteria could also apply, it is usually an essential condition that the color pixel or a subpixel within the TFT pixel must not overlap in adjacent TFT pixels but must lie within the TFT pixel region for all pixels via an active matrix display.

Accordingly, a landing zone is an underlying structure within the display, for example a TFT driven pixel of a display, wherein the landing zones are preferably intended to be printed in each case with exactly one individual pattern. In principle, the landing zones can be physically provided on the substrate or can represent only specific positions over the total surface area, which are not directly visible, however, on the substrate itself. In this case, a substrate can have one or more different types of landing zones. Different types of landing zones can, for example, be printed with different printing media and can receive different quantities of the printing medium or can have different geometries. Preferably, the types of landing zone on the substrate are arranged systematically or periodically repeating in at least one, preferably in two spatial directions or form repeating, superordinate patterns. Particularly preferably, an e-paper or an EPD has at least three types of landing zone in the colors red, green and blue. In addition, it is conceivable for landing zone types of different shape and/or size to be provided for one or more of these colors, so that the total number of the types of landing zone to be printed on the substrate is increased accordingly. Thus, multiple landing zone grids can be arranged offset from one another on a substrate surface, wherein multiple landing zone grids are preferably arranged in each case in the intermediate space of the other landing zone grid, in particular such that the individual landing zones of the different landing zone grids are periodically repeated along the substrate surface. Very particularly preferably, multiple landing zone grids are provided with an origin that is slightly offset from one another, the landing zone grids preferably being formed identically to one another.

According to the invention, the individual landing zones of the substrate are arranged in a landing zone grid consisting of landing zone columns and landing zone rows, the landing zone columns and the landing zone rows preferably being positioned at a fixed angle and/or in a constant arrangement relative to one another over the entire substrate surface. Particularly preferably, the landing zone columns and the landing zone rows are aligned perpendicularly to one another and/or in a rectangular matrix. Furthermore, the landing zone grid is preferably formed in such a way that it can be aligned relative to the print head in such a way that the landing zone rows run substantially parallel to the printing direction, whereby line-by-line printing is possible in a particularly simple manner. Although it is preferred that the individual landing zone columns and landing zone rows are formed identically to one another, they can also differ from one another in their size and/or arrangement, up to a random placement of the individual landing zones in the landing zone grid, which then is a pseudo-random grid. In order to align the substrate relative to the printing device or for nozzle control, the substrate can also have alignment features which can preferably be detected visually or otherwise by sensors.

However, the substrate and in particular the landing zone grid do not, in principle, have to have a parallel and/or defined orientation or alignment relative to the nozzle path. Rather, the landing zone columns or landing zone rows can be aligned as desired relative to the nozzle path. Accordingly, it is not absolutely necessary for the invention that the nozzle paths follow the landing zone columns or the landing zone rows. For example, the nozzle path may also intersect landing zone columns during a pass, i.e., print in a first portion of the pass in a landing zone of a first landing zone column, then may pass over a boundary between at least two adjacent landing zone columns and does not print there, and lastly can print individual patterns or parts thereof once more into the landing zones of a further landing zone column.

An individual pattern is an individual printed area, wherein each individual pattern is formed from one or more printing medium drops or ink drops from one or more print head nozzles. Preferably, each individual pattern is printed in exactly one landing zone or each landing zone contains exactly one individual pattern printed in one or more passes. All individual patterns for a landing zone type are particularly preferably identical to one another and, in this case, very particularly preferably are printed from an identical arrangement and/or number of drops of the printing medium.

According to the invention, all individual patterns, in particular each individual landing zone row, are printed in multiple passes, i.e., in more than one pass of the print head, with only part of the individual patterns and/or only parts of the individual patterns being printed with each pass. Preferably, there is no printing of an individual pattern on an already printed individual pattern in any of the passes. Particularly preferably, the printing is performed in passes such that all individual patterns of a landing zone column to be printed are printed after the last pass over a landing zone column.

In each pass, individual patterns are printed along the nozzle path and preferably exclusively in landing zones. By contrast, there is preferably no printing in areas outside a landing zone, on a boundary between two landing zones, or in such a way that the printing medium simultaneously enters two adjacent landing zones.

The advantageous effect of the invention is decisively achieved by the fact that, according to the invention, the print head and the substrate are moved relative to one another by a lateral distance between the printing of individual passes laterally to the nozzle path, this initially merely meaning that the print head or the print head nozzles or alternatively the substrate is moved relative to the print head laterally at any angle or with a rectangular component to the nozzle path not equal to zero. Preferably, the lateral movement is performed at a fixed angle along a defined movement vector and/or particularly preferably at right angles to the nozzle path, at least for each individual landing zone row, preferably for the entire substrate. The lateral displacement can take place every time by an identical distance, by a sequence of distances deviating from one another and/or in each case by a random distance.

This distance can be both an integer multiple of the distance between two adjacent print head nozzles, whereby printing is performed in the native resolution of the print head, and additionally by a further increment of this distance, as a result of which the actual lateral resolution is increased beyond the native resolution. Particularly preferably, the print head is displaced transversely to the printing direction during each pass, whereby the lateral resolution can be increased by an n passing of the print head relative to the substrate. Accordingly, under the actual lateral resolution $a_{res}$ is the number of nozzle paths per length unit.

Since, due to the lateral offset, a deviating optical impression of individual portions on the substrate surface can already be successfully avoided, a volume determination of the droplet dispensed from each specific print head nozzle is not necessary in principle. In addition, it is also not necessary to achieve a particularly volume-precise printing of the individual patterns or into the landing zones. Accordingly, an embodiment of the method is preferred in which the volume of the printing medium is generally not taken into account, particularly preferably in the determination of the lateral offset to be implemented. In particular, it is advantageous that the volume delivered by each specific print head nozzle is not determined and/or not taken into consideration, since numerous factors of this volume generally determined for the print head nozzle may change. Accordingly, the method is preferably carried out regardless of the drop volume.

A preferred development of the method according to the invention for printing a substrate provides that, in the one or more positions following a first position and/or in the one or more passes following a first pass, and preferably in each position or in each pass, missing parts of individual patterns or entire individual patterns are printed only in incomplete or empty landing zones, but not in landing zones already containing a complete individual pattern, whereby on the one hand the desired surface coverage is achieved with individual patterns in a simple manner after the printing of the last layer and/or after the last pass, and on the other hand a larger quantity of the printing medium was not applied to any landing zone, which could possibly lead likewise to perceptible optical unwanted artefacts. In a particularly preferred development of the method, each individual pattern is printed completely in exactly one position and/or in one pass, as a result of which a particularly uniform printing of the individual patterns is achieved and an uneven running of printing medium during application into an already partially printed individual pattern is effectively prevented.

In a preferred embodiment of the method according to the invention for printing a substrate, after the printing of all the positions or after all passes of the print head relative to the respective region of the substrate, in particular over any landing zone column and/or landing zone row, all individual patterns are completed and/or no empty or unprinted landing zones remain, so that the complete printing only takes place divided into several passes and/or the finished print result does not differ with respect to the number and arrangement of the individual patterns from a conventional printing of the prior art. By contrast, the quality of the print result of a print produced by the method according to the invention is significantly superior to a print of the prior art.

In principle, any portion of the entirety of all individual patterns can be printed in each pass, but an embodiment of the method according to the invention for printing a substrate is preferred in which the printing, in particular of each individual landing zone column, takes place in u passes and approximately 1/u of all individual patterns or approximately 1/u of all parts of the individual patterns are printed in each pass. Particularly preferably, in each pass ±25% of all individual patterns or parts of individual patterns, particularly preferably ±10% of all individual patterns or parts of individual patterns and very particularly preferably ±5% of all individual patterns or parts of individual patterns are printed.

The selection of the individual patterns to be printed in a pass can in principle be made according to any desired criteria, it being preferred, however, that the selection of all parts of an individual pattern to be printed in a pass and/or of the part of the individual patterns to be completely printed is determined randomly or pseudo-randomly, in particular for each landing zone column. In particular, the random selection of the individual patterns to be printed or of the parts thereof is preferably made again and/or independently of previously printed landing zone columns for each pass of the print head and/or for each landing zone column.

Further preferably, the print head and the surface of the substrate are offset relative to one another by a distance or a lateral offset, which is greater than an individual pattern and in particular greater than the extent of an individual pattern in the lateral direction, between some or all of the passes, thereby ensuring that two individual patterns of a landing zone column printed in different passes cannot be printed with the involvement of a single, identical print head nozzle, and therefore no repetition of printing errors due to a property of a specific print head nozzle can occur. Preferably, the lateral offset is less than 50%, particularly preferably less than 33% and very particularly preferably less than 25% of the width of the print head or of the part of the print head having print head nozzles. Further preferably, the lateral offset is smaller than the width of the print head in the lateral direction or of the part of the print head having the print head nozzles divided by the number of passes and/or positions.

An advantageous development of the method according to the invention provides that the lateral offset x is unequal to the minimum print nozzle spacing or the smallest nozzle path distance a of the print nozzle head, so that a higher position resolution than the native position resolution of the print head is achieved by the printing in multiple passes, and a smallest distance $a_{res}$, which is smaller than a, results between two nozzle paths of the actual position resolution.

It is very particularly preferred that, in order to increase the position resolution above the native position resolution of the print head, each landing zone column is printed in k interlacing passes, wherein the print head and the surface of the substrate are each offset relative to one another by a lateral interlacing distance $$x = j \times \frac{a}{k},$$

where a is the smallest distance between two nozzle paths, in particular the native printing resolution, or is the distance a between two adjacent print head nozzles of the print head. In addition, j<k is particularly preferably selected. Here, j is preferably selected from the amount of all natural numbers including zero. The integer j can vary from pass to pass or can be the same for several passes or the entire printing process. Thus, the number of interlaces k for increasing the print resolution is used, so that, with a native print resolution of 600 ppi and k=4, an effective print resolution of 2400 ppi on the substrate can be achieved.

A preferred embodiment of the method according to the invention for printing a substrate provides that the total number of passes u is at least twice the interlacing passes k and/or the total number of all passes u of a landing zone column is grouped in n positions consisting of, in each case, k interlacing passes, wherein the actual position resolution $a_{res}$ obtained by interlacing is particularly preferably achieved in each layer. The number of interlacing passes k for each layer of the n layers is very particularly preferably the same.

In addition, it is preferred that the lateral offset of individual or all passes is at least equal to the smallest nozzle path distance a of the print nozzle head so that the same print head nozzle is not positioned above the same landing zone column during two passes, preferably resulting in a lateral offset x by least one print nozzle distance x=i×a with i=$\mathbb{R}$ ≥1 and particularly preferably with i=$\mathbb{N}$ >0. Furthermore, it is particularly preferred that the lateral offset occurs at least for some passes, preferably for all passes outside one layer, and in particular for all passes, both by an interlacing distance and by a print nozzle distance. Accordingly, the print head and the surface of the substrate during printing with k interlacing passes in, in each case, n layers with at least u=k×n passes are offset relative to one another preferably after each pass by a distance $$x = i \times a + j \times \frac{a}{k}$$

with i,j=$\mathbb{N}$, where a is the smallest distance between two nozzle paths, i is preferably selected individually for each pass, and preferably j<k, and particularly preferably j=1.

Preferably, in each case k interlacing passes of each landing zone column form a complete position. Although it is conceivable in principle that all the interlacing passes of each layer take place directly one after the other, it is also possible that arbitrary passes of other landing zone columns and/or an arbitrary offset by a print nozzle distance and/or by an interlacing distance can take place between the individual interlacing passes of every layer. Thus, the printing of a layer can also be interrupted by further passes, in particular with a greater lateral offset. In general, however, it is preferred that, for each individual landing zone column, k interlacing passes are ultimately carried out and the full interlacing resolution is thus achieved for each landing zone column.

Although the predominant majority of the optical unwanted artefacts of the print result are already prevented by means of the method according to the invention, the individual occurrence of such, readily visible unwanted artefacts, in particular in the form of strip formation, may still occur. In particular, coherent effects of nozzle properties enable an optically discernible fluctuation of the optical properties of the individual patterns on the substrate, which have a typical repetition distance (wavelength) of several individual nozzle pattern distances, frequently several millimeters to a few centimeters. Accordingly, an advantageous development of the method according to the invention provides that a first test print is created with a print head and this test print is checked for unwanted artefacts which are repeated in the lateral direction, wherein, if one or more periodic lateral unwanted artefacts occur, in particular if intensity maxima and/or a strip formation occur, at least one lateral unwanted-artefact distance λ is determined and, during subsequent printing of a substrate, the lateral distance x between the layers and/or the passes is determined by $$x = \lambda \times \left( i + \frac{1}{n} \right)$$

"with" i=$\mathbb{N}$ "and" n="number of layers", in order to optically reduce any discernible coherent effects with a wavelength A on the substrate, or even effectively prevent an occurrence of periodic lateral unwanted artefacts, by clever selection of the lateral offset x between the print layers. The integer i can vary from layer to layer or from pass to pass or may be the same for the entire zone of landing zone column or the entire print. The lateral unwanted-artefact spacing A is the smallest distance between two unwanted artefacts periodically repeating in the lateral direction, for example two intensity maxima. Additionally or alternatively, the lateral distance x of the passes can be selected such that, in the interval of [0, λ] including λ the averaged lateral position of all passes is between ¼λ and ¾λ and in particular ½λ±10%. In general, when a substrate is printed, the lateral arrangement of the passes is preferably selected such that the passes counteract the periodic unwanted artefact.

Preferably, a new test print is carried out before each new print and/or after each change of at least one printing parameter, since the occurrence of periodic unwanted artefacts is dependent on numerous influencing variables, such as the shape and size of the individual patterns, of the individual pattern arrangement, of the print resolution and of the print head used, and it is therefore expedient to check in principle for the occurrence of such periodic unwanted artefacts. In addition, the test print can also be checked for further unwanted artefacts which are not occurring in the lateral direction, wherein these unwanted artefacts likewise can be taken into consideration when determining an ideal lateral distance x. In the method, the test print can only be provided in order to check for possible unwanted artefacts, or the test print can also be a previous, productive print, so that at least one previous print can be used as test print for subsequent prints in the ongoing production or printing process. Particularly preferably, a larger number of previous prints is used in each case as test print and, on the basis of the plurality of previous test prints, an evaluation is performed on lateral and, in particular, also periodically occurring unwanted-artefact distances which can be used individually or overall in the determination of the lateral distance x to avoid such unwanted artefacts.

In order to yet further optimize the method according to the invention for printing a substrate, it can be provided that the number of layers n is selected to be the same as the number of interlaces or interlacing passes k, in particular over each individual landing zone column, and/or the lateral distance $x=(n\times i+1)\times a_{res}$ with $i=\mathbb{N}$, wherein $a_{res}$ is the smallest distance between two nozzle paths of the actual position resolution obtained by interlacing, whereby on the one hand a particularly efficient printing process is achieved and, on the other hand, the nozzle paths are prevented from running exactly one above the other in the individual layers. The actual position resolution is therefore given here by $$a_{res} = \frac{a}{k},$$

wherein particularly preferably n>1 and/or k>1. The number of passes here is the number of journeys of the print head with any print head nozzle over an individual landing zone column. Accordingly, it is also preferred that the lateral distance x is not selected as an integer multiple of the minimum print nozzle spacing or the smallest nozzle path distance a so that a subsequent layer is printed with a slight lateral offset to the print nozzle grid or to the nozzle paths of the previous layer, thereby effectively preventing the formation of a strip. In particular, it is preferred in this context that multiple interlacing passes are used to increase the resolution, wherein the individual patterns are distributed equally over the individual, for example 4, interlaces.

A preferred development of the method according to the invention provides that the lateral distance is not selected as an integer multiple of the minimum print nozzle spacing or the smallest nozzle path distance a so that a subsequent layer is printed with a slight lateral offset to the print nozzle grid or to the nozzle paths of the previous layer.

Lastly, in an advantageous embodiment of the method according to the invention, the lateral unwanted-artefact distance is A when the selection of the lateral offset x is taken into consideration and at the same time the lateral distance x is selected as a fractional or non-integer multiple of the minimum print nozzle spacing or the smallest nozzle path distance a and/or the smallest distance between two nozzle paths of the actual position resolution $a_{res}$, wherein at the same time the factors i in each case are selected such that the lateral distance x is as small as possible. In particular, the lateral distance x is preferably determined by $$x_1 = \lambda \times \left(i_1 + \frac{1}{n}\right)$$

with $i_1 = \mathbb{N}$ and n=number of the layers and at the same time by $x_2 = (n \times i_2 + 1) \times a_{res}$ with $i_2 = \mathbb{N}$, wherein the value $|x_2 - x_1|$ is minimized, in particular by the respective selection of the respective integers $i_{1,2}$.

Figure 2:
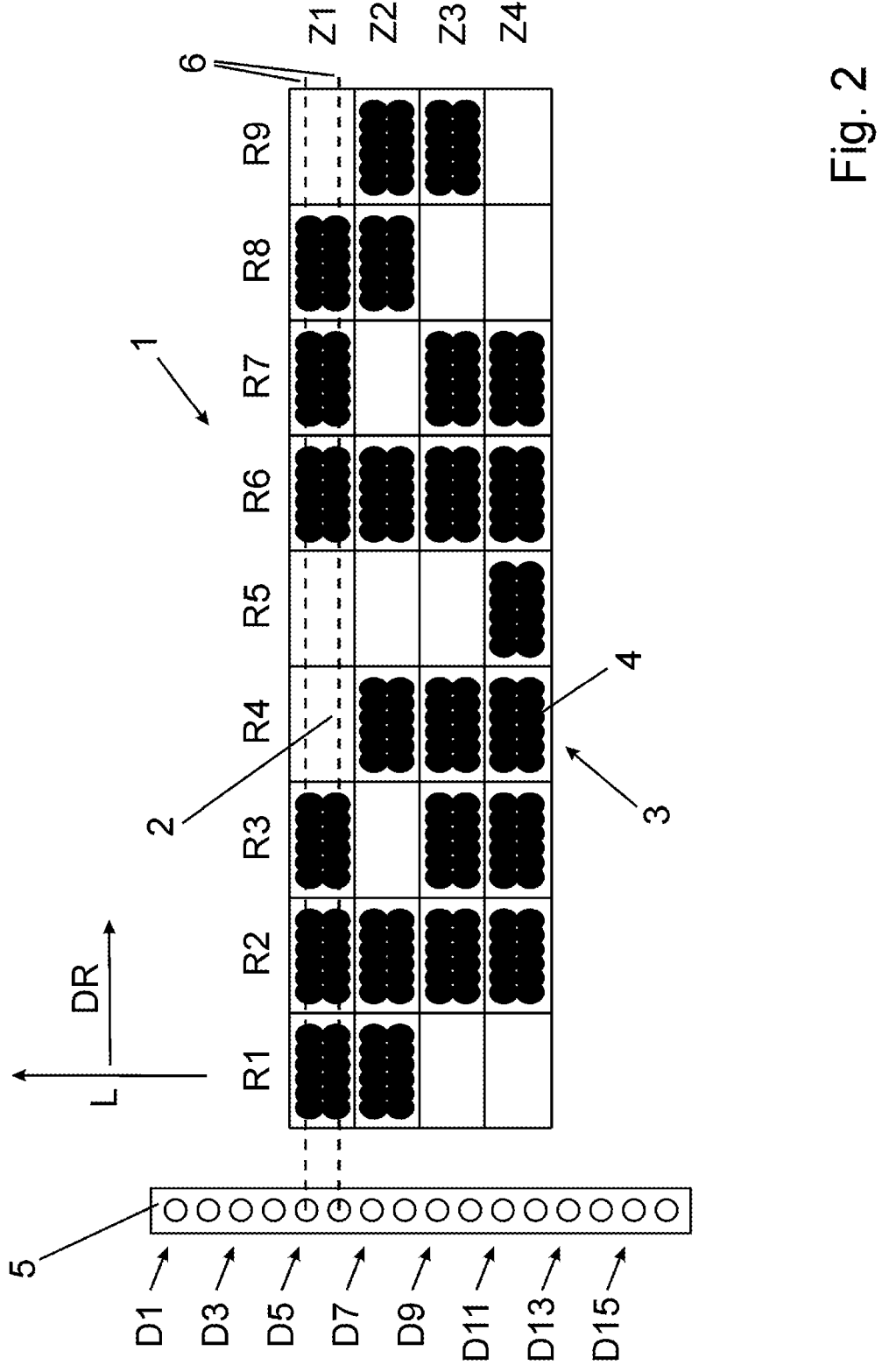
Figure 3:
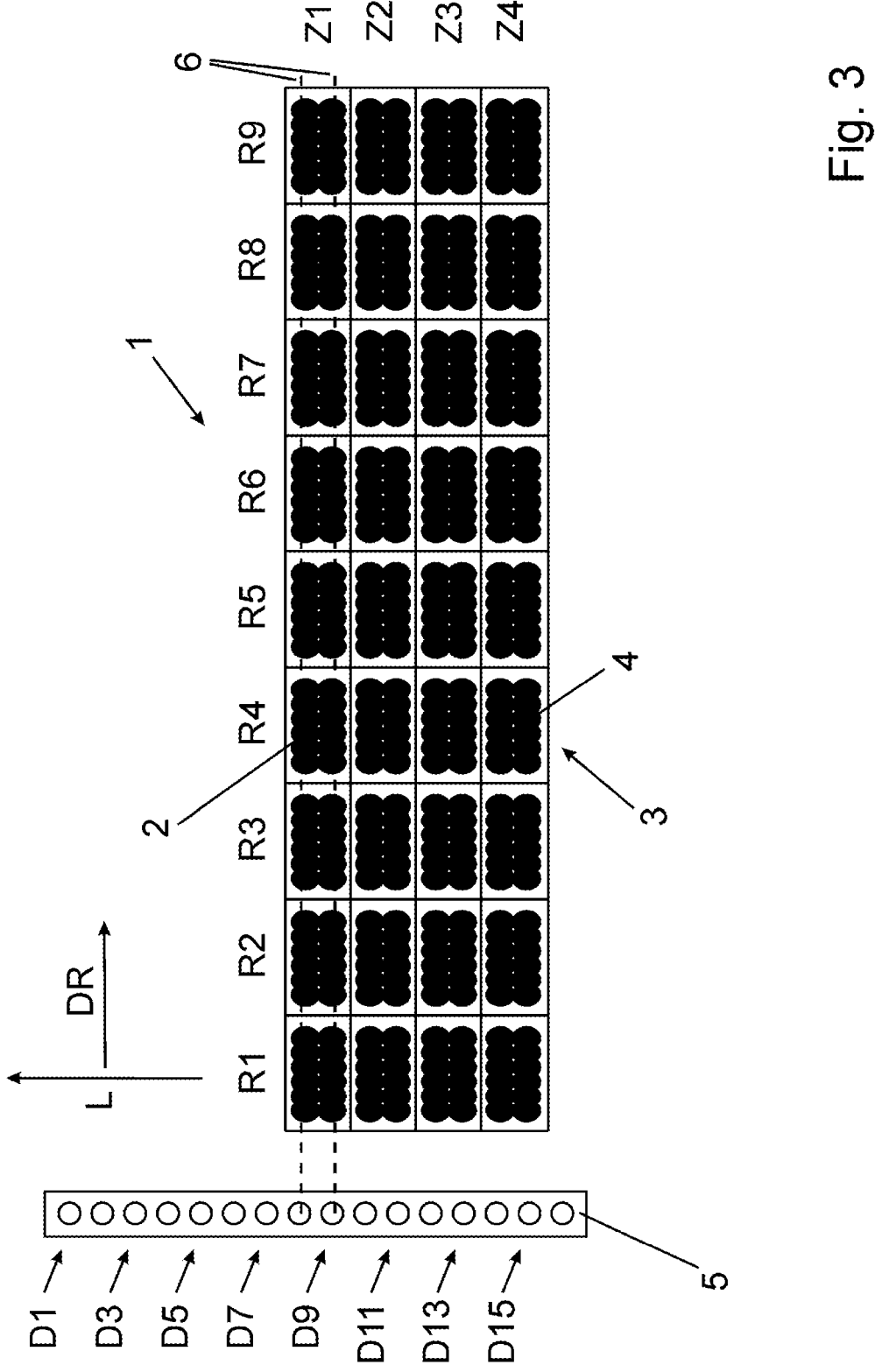
Figure 4:
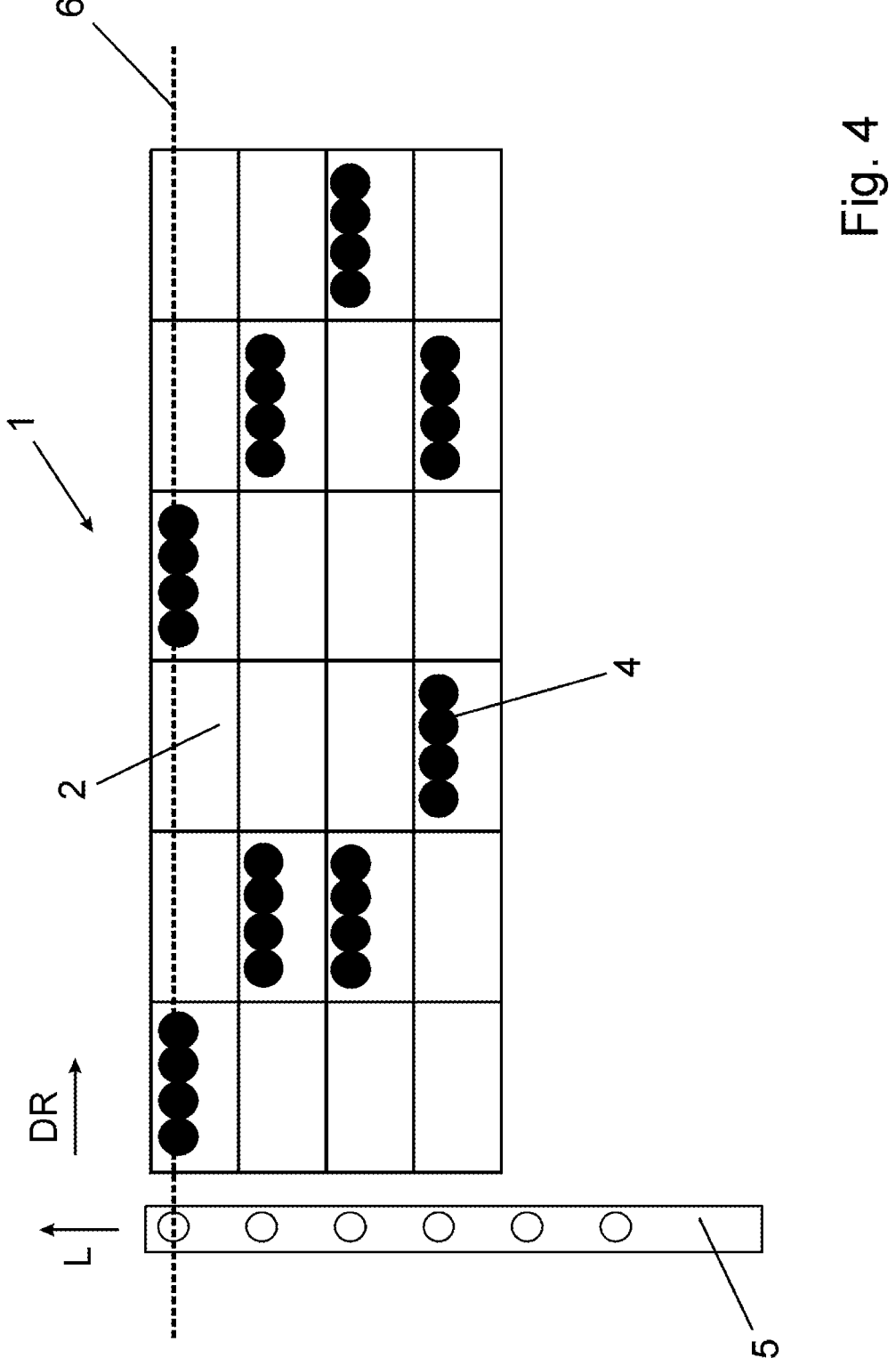
Figure 5:
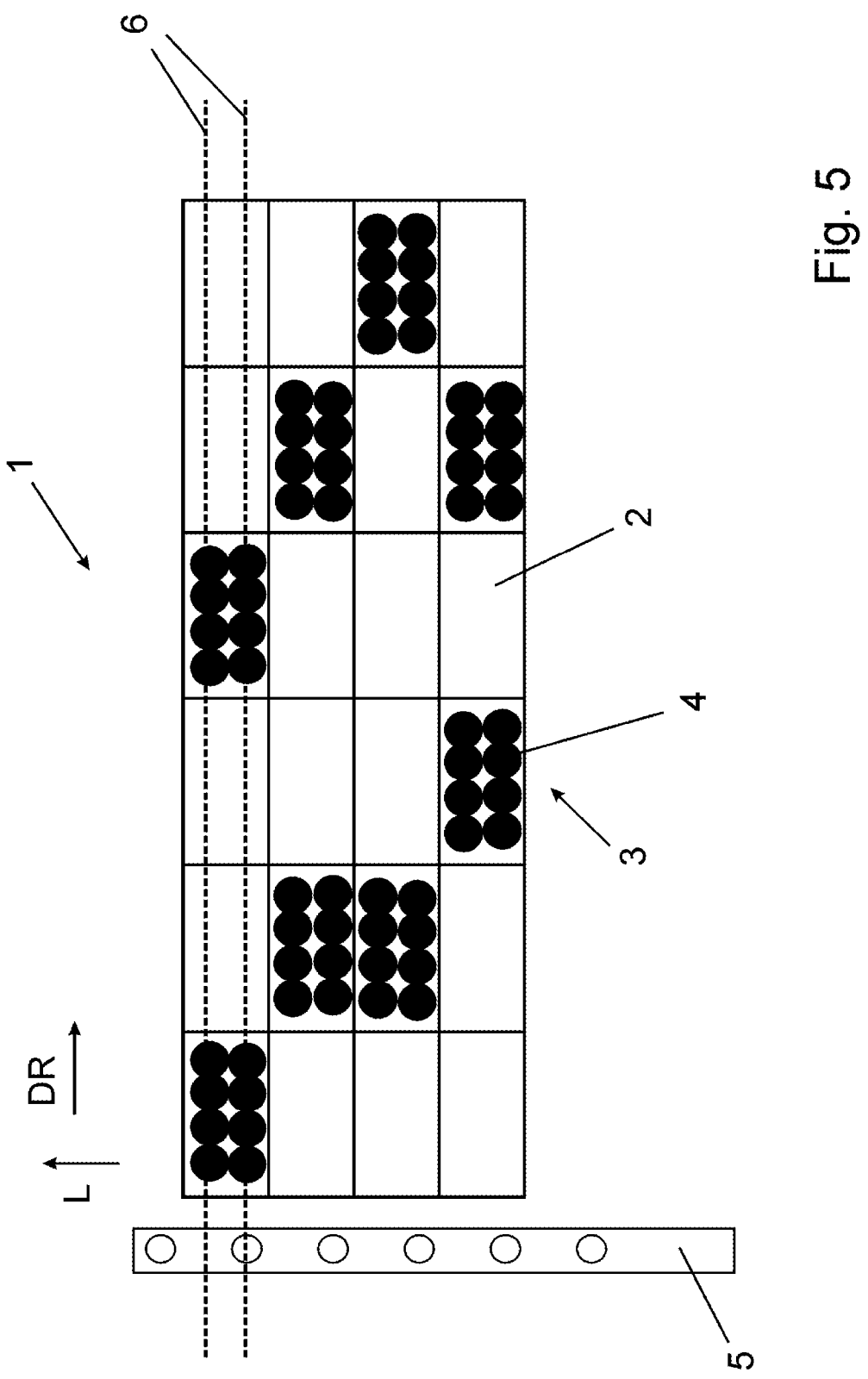
Figure 6:
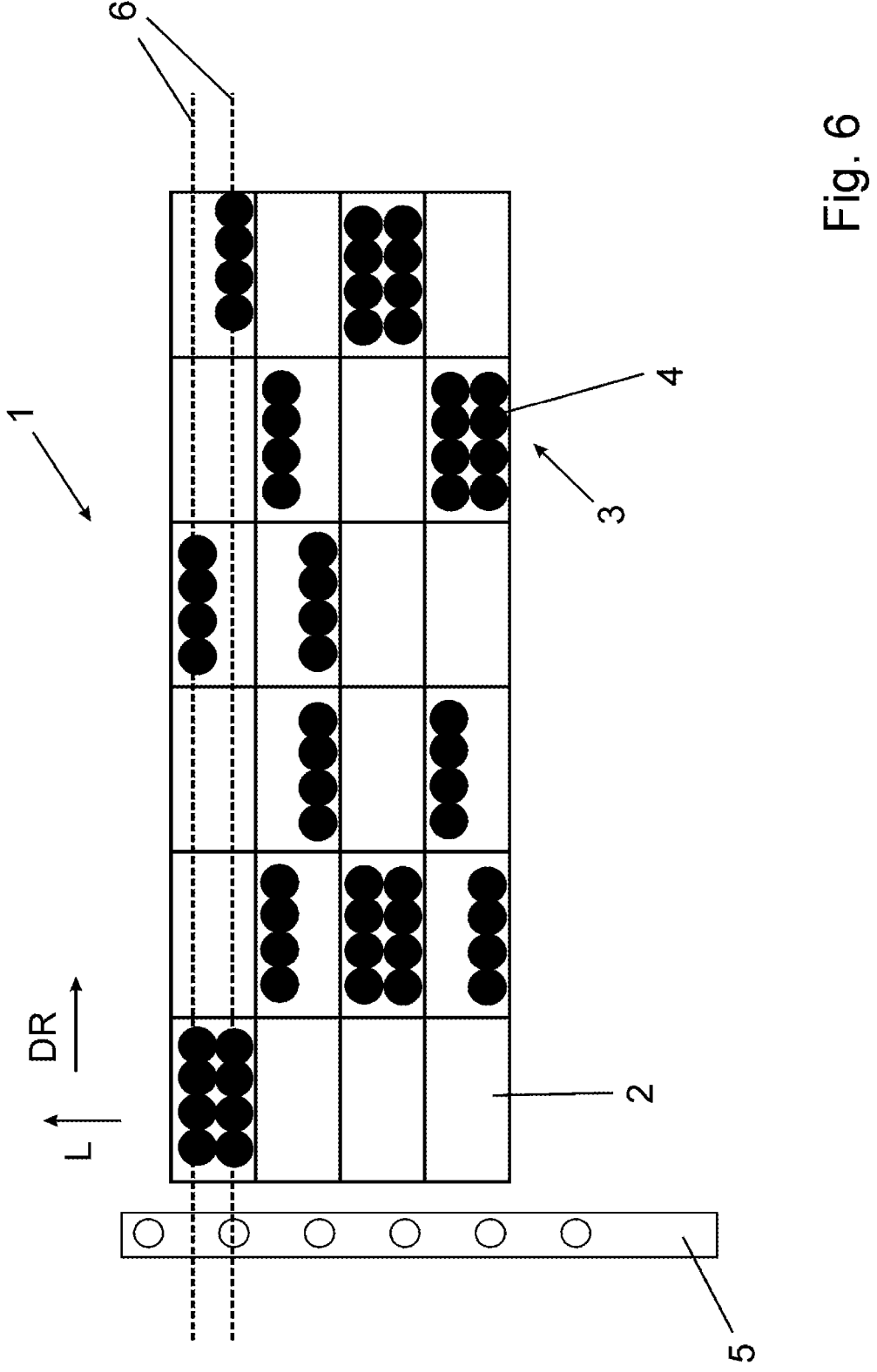
Figure 7:
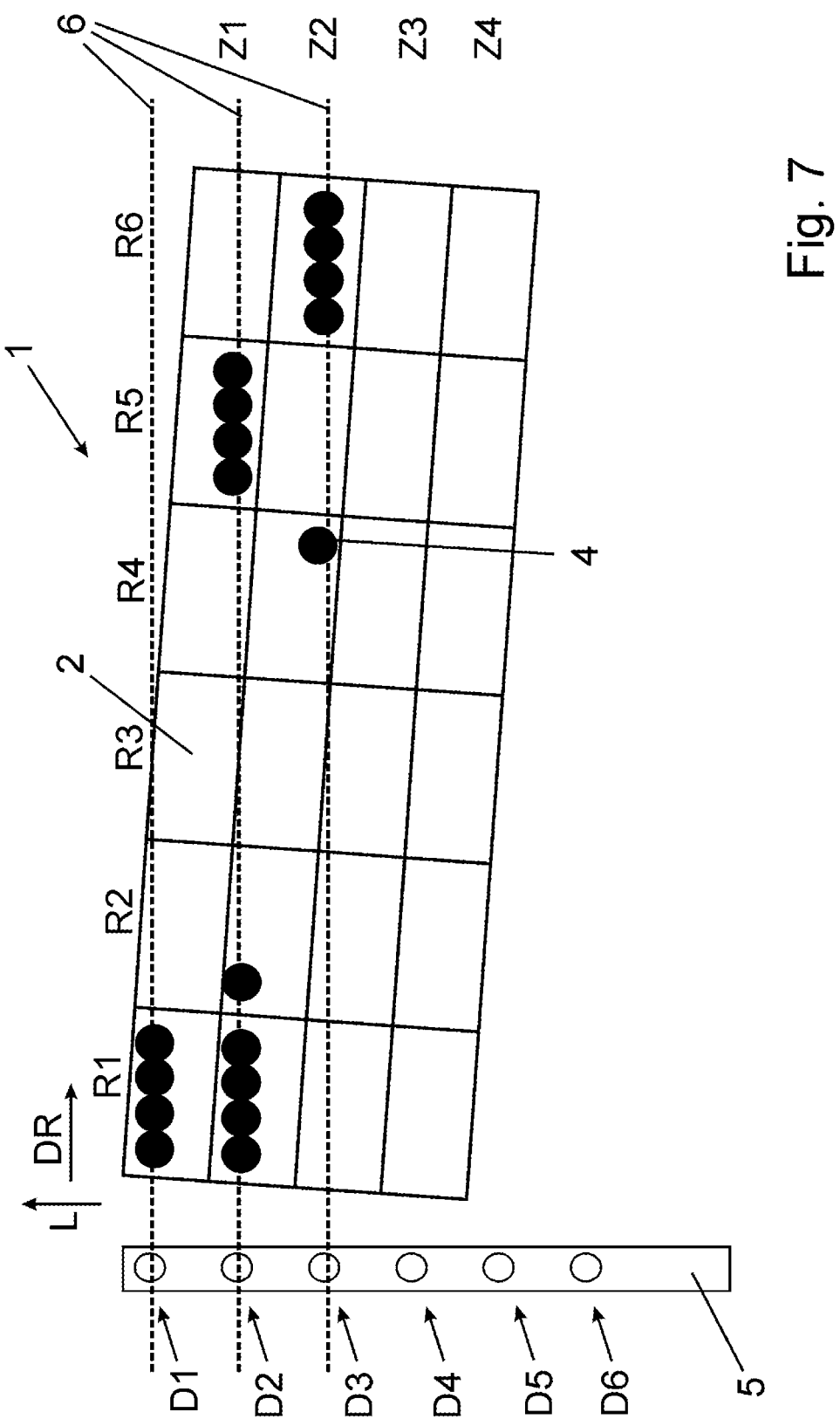
Figure 8:
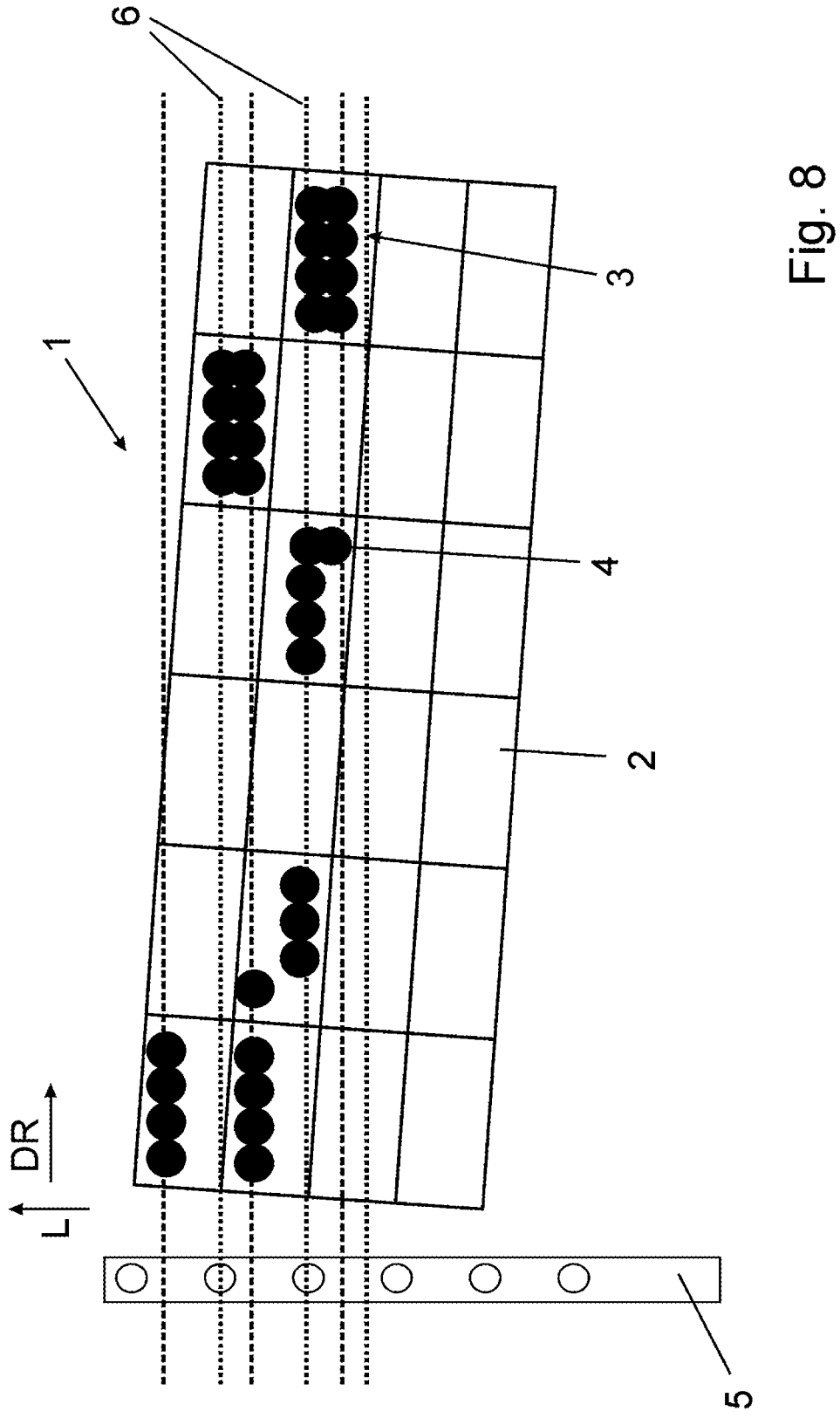
Figure 9:
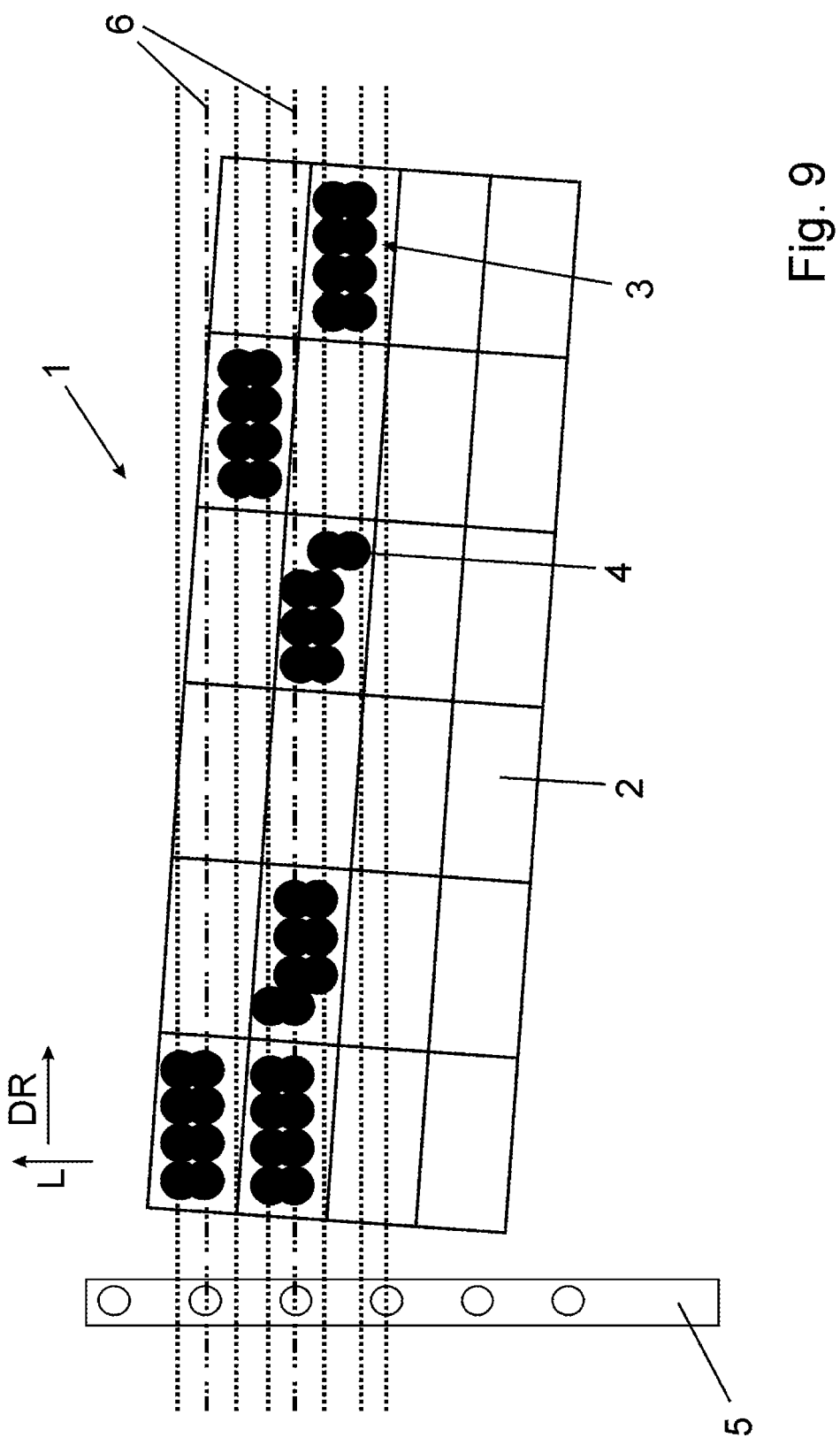

An exemplary embodiment of the method according to the invention is explained in greater detail below with reference to the drawings. In the figures:

FIG. 1 shows a schematic view of a first embodiment of a substrate printed with a first pass with a corresponding alignment of the print head, FIG. 2 shows a schematic view of the substrate shown in FIG. 1 after the printing of a second pass with a corresponding alignment of the print head, FIG. 3 shows a schematic view of the substrate shown in FIG. 2 after the printing of a third and last pass with a corresponding alignment of the print head, FIG. 4 shows a schematic view of a second embodiment of a substrate printed with a first pass with a corresponding alignment of the print head, FIG. 5 shows a schematic view of the substrate shown in FIG. 4 after the printing of a second pass with a corresponding alignment of the print head, FIG. 6 shows a schematic view of a third embodiment of a substrate printed with two passes with printed partial patterns, FIG. 7 shows a schematic view of a fourth embodiment of a rotated substrate, printed with a first interlacing pass, with a corresponding alignment of the print head, FIG. 8 shows a schematic view of the substrate shown in FIG. 7 after the printing of a second interlacing pass with a corresponding alignment of the print head, and FIG. 9 shows a schematic view of the substrate shown in FIG. 8 after the printing of a third and last interlacing pass with a corresponding alignment of the print head.

A flexible e-paper display as an example of a flexible substrate 1 with a black/white resolution of 150 ppi with, in each case, a TFT pixel size of 170 μm is to be printed by way of example with an individual filter color. Each color pixel should be somewhat smaller than the TFT pixel size, i.e., approximately 150 μm. Accordingly, landing zones 2 for receiving the filter color are provided on the substrate 1 in a rectangular grid consisting of landing zone columns Zx and landing zone rows Rx. The landing zone columns Zx run here in a printing direction DR, in which the substrate 1 can be moved below a print head 5 having sixteen print head nozzles Dx arranged in a row in order to be able to print the substrate 1. In this case, each print nozzle Dx follows a linear nozzle path 6 along the surface of the substrate 1. In practice and in contrast to this greatly simplified example, it is typically not an individual landing zone grid, but multiple landing zone grids shifted relative to one another that are printed, wherein the individual landing zones 2 of a landing zone type are arranged repeatedly on the substrate 1. Typically, at least one landing zone 2 of a landing zone type, for example a color, is printed in a color pixel.

In order to compensate for the influence of specific properties and in particular errors of individual print head nozzles Dx and to obtain a uniform, strip-free print result, the printing is performed in several passes, in this case in three passes (see FIG. 1-3).

In this case, in a first step, ⅓ of all individual patterns 3 of any landing zone column Zx to be printed in a landing zone 2 are randomly selected and printed in the printing direction DR during a pass of the print head 5 over the substrate 1 (see FIG. 1). Each individual pattern 3 is printed here by means of two adjacent individual print head nozzles Dx of the print head 5, wherein, for example, the first landing zone column Z1 is printed by the print head nozzles D1 and D2. For this purpose, six drops 4 of the filter color are printed in each landing zone 2 through each of the print head nozzles Dx.

After ⅓ of all individual patterns 3 have been printed on the substrate 1 in the first pass, the print head 5 is moved in a lateral direction L in such a way that the print head nozzles D1 and D2 are no longer positioned in front of the first landing zone row Z1, but rather the two print head nozzles D5 and D6 (see FIG. 2). Subsequently, an identical printing operation takes place, wherein, once again, a further third of all individual patterns 3 to be printed in a landing zone column Zx are printed during a pass. However, further individual patterns 3 are printed exclusively in unprinted, empty landing zones 2, so that, after the second pass of the print head 5, $\frac{2}{3}$ of all individual patterns 3 are printed.

Subsequently, the print head 5 is again moved by a distance in the lateral direction L, so that now the print head nozzles D8 and D9 print the first landing zone columns Z1 (see FIG. 3). In the case of a last pass of the print head 5 over the substrate, the remaining third of the individual patterns 3 is now printed, so that, after the printing of all three passes, all landing zones 2 are filled with the filter color.

In addition, after the printing of a defined number of landing zone columns Zx, the already printed substrate 1 is examined for the occurrence of repeating strip patterns visible to the naked eye. Should such strip patterns be recognized, the repetition distance λ of the strips is then determined. If, for example, λ=12 mm in the lateral direction and printing is continued in three passes, the lateral offset x of the print head 5 is selected between each of the three passes so that approximately x=12*(Z+⅓) mm is satisfied, for example with Z=0: x=4 mm. In addition, a lateral offset of x=12 mm, which would ensure that a repeating strip pattern is positively amplified, since here, for example, in each pass the more intensive strips would be positioned over more intensive stripes of the other passes, is avoided.

In an alternative embodiment illustrated in FIGS. 4 and 5, in order to increase the actual print resolution above the native print resolution of the print head 5, the printing is performed in interlaces, so that each individual pattern 3 of a position is printed within two passes. During a first pass (see FIG. 4), a first part of the individual patterns 3 is printed in the region of the nozzle path 6 and then the print head 5 is displaced in the lateral direction L by an interlacing offset so that a nozzle path 6 between the nozzle paths 6 of two adjacent print head nozzles Dx of the previous pass is then reached, and then the second part of the individual pattern 3 can be printed with increased effective resolution.

In this case, all passes of a position can be performed directly one after the other, as shown in FIGS. 4 and 5, or parts of individual patterns 3 or entire individual patterns 3 of other positions are initially printed, as is shown in FIG. 6. In addition, it is conceivable to print individual patterns 3 only incompletely if this is advantageous or necessary.

Lastly, FIGS. 7-9 show three successive passes of a further embodiment, in which the substrate 1 has not been aligned in parallel with respect to the nozzle paths 6, but is oriented arbitrarily, here at an angle. In addition, a printing with multiple interlacing passes for increasing the actual print resolution beyond the native resolution of the print head 5 is carried out again. Within the scope of a first pass, individual drops 4 of an individual pattern 3 are always printed in a landing zone 2 when the nozzle path 6 runs within a landing zone 2 or not over a landing zone boundary, where a printing would then take place simultaneously in two adjacent landing zones 2 (see FIG. 7).

During the subsequent pass, once again only an individual drop 4 of an individual pattern 3 is printed in a landing zone 2 when the nozzle path 6 runs within a landing zone 2 or not over a landing zone boundary (see FIG. 8), so that further parts of the individual patterns 3 are added. Lastly, according to the same rules, a third pass is performed over the same landing zone columns Lx, wherein the started individual patterns 3 are then completed (see FIG. 9). In the first two landing zone columns L1 and L2, 50% of all landing zones 2 are now printed so that once again 3 passes are performed in order to print the still empty landing zones 2 with the same interlacing resolution and thus to complete the overall pattern.

REFERENCE SIGNS 1 substrate
2 landing zone
3 individual pattern
4 drop
5 print head
6 nozzle path
DR printing direction
L lateral direction
Dx print head nozzle x
Rx landing zone row x
Zx landing zone column x

The invention claimed is:

1. A method for printing on a substrate by inkjet printing, in which method
   landing zones are provided on the substrate in a landing zone grid consisting of landing zone columns and landing zone rows, and
   the landing zones are each printed on using an individual pattern consisting of one or more drops by print head nozzles of a print head, wherein
   the print head nozzles and the surface of the substrate are moved relative to one another along an imaginary nozzle path during printing, wherein
   all individual patterns of a landing zone column are printed in multiple passes, wherein
   in each pass, only parts of individual patterns and/or only some of all individual patterns are printed along the nozzle path in landing zones, and
   in at least one subsequent pass, missing parts of individual patterns or further entire individual patterns are printed in incomplete or empty landing zones, and
   between the individual passes, the print head and the surface of the substrate are moved relative to one another laterally to the nozzle path by a lateral offset, wherein
   a first test print is created with the print head and is checked for unwanted artefacts which are repeated in the lateral direction, wherein, when periodic lateral unwanted artefacts occur, a lateral unwanted artefact distance A is determined and, during subsequent printing of a substrate, the lateral distance x between the layers is determined by $$x = \lambda \times \left(i + \frac{1}{n}\right)$$

with i∈ N and n=number of layers and/or the lateral distance x of the passes is selected such that, in an interval of [0, λ] including λ, an average lateral position of all passes is ¼λ to ¾λ.

2. The method for printing on a substrate according to claim 1, wherein, in each pass, missing parts of individual patterns or whole individual patterns are printed only in incomplete or empty landing zones of a landing zone column, each individual pattern optionally being printed completely in exactly one pass.

3. The method for printing on a substrate according to claim 1, wherein all individual patterns of the landing zone columns of the landing zone column are completed only after all passes of a landing zone column and no unprinted landing zones remain.

4. The method for printing on a substrate according to claim 1, wherein each individual landing zone column is printed in u passes, and approximately 1/u of all individual patterns or 1/u of all parts of the individual patterns of the landing zone columns are printed in each pass.

5. The method for printing a substrate according to claim 1, wherein all parts of an individual pattern that are to be printed in a pass and/or the individual patterns to be completely printed in a pass are randomly or pseudo-randomly determined.

6. The method for printing on a substrate according to claim 1, wherein, between some or all passes, the print head and the surface of the substrate are offset relative to one another by a distance which is greater than an individual pattern and greater than the extent of an individual pattern in the lateral direction.

7. The method for printing on a substrate according to claim 1, wherein the lateral offset x is unequal to the minimum print nozzle spacing or the smallest nozzle path distance a of the print nozzle head, so that a higher position resolution than the native position resolution of the print head is achieved by printing in multiple passes.

8. The method for printing on a substrate according to claim 1, wherein, in order to increase the position resolution beyond the native position resolution of the print head, each landing zone column is printed in k interlacing passes, wherein the print head and the surface of the substrate are each offset relative to one another by a lateral interlacing distance $x=j\times a/k$, wherein a is the smallest distance between two nozzle paths and $j<k$.

9. The method for printing on a substrate according to claim 1, wherein the total number of passes u is at least twice the interlacing passes k and/or the total number of all passes u of a landing zone column is grouped in n positions from, in each case, k interlacing passes, wherein in each position the actual position resolution $a_{res}$ obtained by interlacing is achieved.

10. The method for printing on a substrate according to claim 1, wherein the lateral offset of individual or all passes is at least equal to the smallest nozzle path distance a of the print nozzle head, so that the same print head nozzle is not positioned above the same landing zone column during two passes, with a lateral offset x by at least one print nozzle distance $x=i\times a$ with $i\in R\geq1$ or with $i\in N>0$ occurring.

11. The method for printing on a substrate according to claim 1, wherein in each case k interlacing passes of each landing zone column form a complete layer, with arbitrary passes of other landing zone columns and/or an arbitrary offset by a print nozzle distance and/or by an interlacing distance possibly occurring between the individual interlacing passes of each layer.

12. The method for printing on a substrate according to claim 1, wherein the averaged lateral position of all passes is $\frac{1}{2}\lambda\pm10\%$.

13. The method for printing on a substrate according to claim 1, wherein the number of layers n of a landing zone column equal to the number of interlacing passes k is selected and/or the lateral distance $x=(n\times i+1)\times a_{res}$ with $i\in N$, where $a_{res}$ is the smallest distance between two nozzle paths of the actual position resolution obtained by interlacing, i.e., $a_{res}=a/k$.

14. The method for printing on a substrate according to claim 10, wherein the lateral unwanted artefact distance 1 is taken into consideration when selecting the lateral offset x and at the same time the lateral distance x is selected as an odd multiple of the smallest distance between two nozzle paths of the actual position resolution $a_{res}$, wherein at the same time the factors i used here are selected in each case such that the lateral distance x is as small as possible.

15. A method for printing on a substrate by inkjet printing, in which method landing zones are provided on the substrate in a landing zone grid consisting of landing zone columns and landing zone rows, and the landing zones are each printed on using an individual pattern consisting of one or more drops by print head nozzles of a print head, wherein the print head nozzles and the surface of the substrate are moved relative to one another along an imaginary nozzle path during printing, wherein all individual patterns of a landing zone column are printed in multiple passes, wherein in each pass, only parts of individual patterns and/or only some of all individual patterns are printed along the nozzle path in landing zones, and in at least one subsequent pass, missing parts of individual patterns or further entire individual patterns are printed in incomplete or empty landing zones, and between the individual passes, the print head and the surface of the substrate are moved relative to one another laterally to the nozzle path by a lateral offset, wherein the print head and the surface of the substrate during printing with k interlacing passes in, in each case, n layers with at least $u=k\times n$ passes are offset relative to one another after each pass by a distance $$x = i\times a + j\times\frac{a}{k}$$

with $i,j\in N$, where a is the smallest distance between two nozzle paths, i is selected individually for each pass, or $j<k$, or $j=1$.

16. A device for printing on a substrate comprising a landing zone grid consisting of landing zone columns and landing zone rows, by inkjet printing, the device having:

at least one print head comprising multiple print head nozzles spaced apart from one another at a distance, for printing in each case an individual pattern consisting of one or more drops into a landing zone of the landing zone grid by one or more print head nozzles, a positioning drive for moving the print head and the surface of the substrate relative to one another along an imaginary nozzle path of each of the print head nozzles and in a direction laterally to the nozzle paths, and a control unit for controlling the printing process, in particular the positioning drive, wherein the control unit is designed such that all individual patterns of a landing zone column is printed in several passes, wherein in each pass, only parts of individual patterns and/or only some of all individual patterns are printed along the nozzle path in landing zones, and in at least one subsequent pass, missing parts of individual patterns or further entire individual patterns are printed in incomplete or empty landing zones, and the print head and the surface of the substrate are moved relative to one another between the individual passes laterally to the nozzle path by a lateral distance, and a first test print is created with the print head and is checked for unwanted artefacts which are repeated in the lateral direction, wherein, when periodic lateral unwanted artefacts occur, a lateral unwanted artefact distance A is determined and, during subsequent printing of a substrate, the lateral distance x between the layers is determined by $$x = \lambda \times \left(i + \frac{1}{n}\right)$$

with $i \in N$ and n=number of layers and/or the lateral distance x of the passes is selected such that, in an interval of $[0, \lambda]$ including $\lambda$, an average lateral position of all passes is $\frac{1}{4}\lambda$ to $\frac{3}{4}\lambda$.

17. A device for printing on a substrate comprising a landing zone grid consisting of landing zone columns and landing zone rows, by inkjet printing, the device having:

at least one print head comprising multiple print head nozzles spaced apart from one another at a distance, for printing in each case an individual pattern consisting of one or more drops into a landing zone of the landing zone grid by use of one or more print head nozzles, a positioning drive for moving the print head and the surface of the substrate relative to one another along an imaginary nozzle path of each of the print head nozzles and in a direction laterally to the nozzle paths, and a control unit for controlling the printing process, in particular the positioning drive, wherein the control unit is designed such that all individual patterns of a landing zone column is printed in several passes, wherein in each pass, only parts of individual patterns and/or only some of all individual patterns are printed along the nozzle path in landing zones, and in at least one subsequent pass, missing parts of individual patterns or further entire individual patterns are printed in incomplete or empty landing zones, and the print head and the surface of the substrate are moved relative to one another between the individual passes laterally to the nozzle path by a lateral distance, and the print head and the surface of the substrate during printing with k interlacing passes in, in each case, n layers with at least u=k×n passes are offset relative to one another after each pass by a distance $$x = i \times a + j \times \frac{a}{k}$$

with $i,j \in N$, where a is the smallest distance between two nozzle paths, i is selected individually for each pass, or $j<k$, or j=1.

* * * * *